United States Patent [19]

Wash

[11] Patent Number: 4,965,575
[45] Date of Patent: Oct. 23, 1990

[54] DATA ALIGNMENT CIRCUIT AND METHOD FOR SELF-CLOCKING ENCODED DATA

[75] Inventor: Michael L. Wash, Pittsford, N.Y.

[73] Assignee: Eastman Kodak Company, Rochester, N.Y.

[21] Appl. No.: 255,578

[22] Filed: Oct. 7, 1988

[51] Int. Cl.⁵ .............................................. H03M 5/14
[52] U.S. Cl. ...................................... 341/72; 375/110; 360/51
[58] Field of Search ............... 341/50, 53, 72, 73, 341/82; 375/20, 22, 23, 25, 110, 112, 55; 360/40, 41, 44, 51

[56] References Cited

U.S. PATENT DOCUMENTS

| | | | |
|---|---|---|---|
| 2,937,914 | 5/1960 | Blake | 346/107 |
| 3,603,974 | 9/1971 | Copeland | 346/23 |
| 3,718,074 | 2/1973 | Davis | 95/1.1 |
| 3,720,927 | 3/1973 | Wolf . | |
| 3,736,849 | 6/1973 | Thompson | 95/1.1 |
| 3,797,025 | 3/1974 | Murphy, Jr. et al. | 354/77 |
| 3,807,851 | 4/1974 | Knox et al. | 353/120 |
| 3,810,218 | 5/1974 | Millett | 354/204 |
| 3,828,356 | 8/1974 | Wiers | 346/108 |
| 3,843,956 | 10/1974 | Kauneckas | 354/108 |
| 3,879,752 | 4/1975 | Heidecker | 360/40 |
| 3,889,281 | 6/1975 | Taguchi et al. | 354/109 |
| 3,971,049 | 7/1976 | Ohmori et al. | 354/127 |
| 3,995,289 | 11/1976 | Shomo | 354/109 |
| 4,001,846 | 1/1977 | Kauneckas | 354/105 |
| 4,025,931 | 5/1977 | Taguchi et al. | 354/105 |
| 4,027,335 | 5/1977 | Miller . | |
| 4,042,298 | 8/1977 | Herrmann | 355/40 |
| 4,073,588 | 2/1978 | Zangenfeind et al. | 355/41 |
| 4,074,294 | 2/1978 | Fujita et al. | 354/106 |
| 4,079,388 | 3/1978 | Takahama et al. | 354/31 |
| 4,080,572 | 3/1978 | Hastings et al. | 375/55 |
| 4,112,444 | 9/1978 | Yonemoto et al. | 354/106 |
| 4,117,502 | 9/1978 | Takeda et al. | 354/106 |
| 4,120,572 | 10/1978 | Grallert et al. | 352/92 |
| 4,150,882 | 4/1979 | Konick | 352/39 |
| 4,182,560 | 1/1980 | Oguchi et al. | 354/106 |
| 4,199,242 | 4/1980 | Hosomizu et al. | 354/145 |
| 4,211,558 | 7/1980 | Oguchi et al. | 430/359 |
| 4,235,544 | 11/1980 | Yamada et al. | 354/106 |
| 4,270,853 | 6/1981 | Hatada et al. | 354/76 |
| 4,270,854 | 6/1981 | Stemme et al. | 354/76 |
| 4,327,979 | 5/1982 | Tominaga et al. | 354/105 |
| 4,340,286 | 7/1982 | Carr | 354/105 |
| 4,344,683 | 8/1982 | Stemme | 354/106 |
| 4,349,272 | 9/1982 | Holthusen | 355/69 |
| 4,357,634 | 11/1982 | Chung | 375/23 |
| 4,361,388 | 11/1982 | Mlcak et al. | 354/106 |
| 4,362,369 | 12/1982 | Kazami et al. | 354/106 |
| 4,365,882 | 12/1982 | Disbrow | 354/106 |
| 4,368,967 | 1/1983 | Imura | 354/106 |
| 4,384,771 | 5/1983 | Sakurada et al. | 354/105 |
| 4,400,457 | 8/1983 | Johnson | 430/140 |
| 4,422,752 | 12/1983 | Thurm et al. | 355/41 |

(List continued on next page.)

FOREIGN PATENT DOCUMENTS 246799A 11/1987 European Pat. Off. .
0293887 6/1988 European Pat. Off. .
2159466 6/1973 Fed. Rep. of Germany .

(List continued on next page.)

OTHER PUBLICATIONS

*Research Disclosure*, 1984, H. J. Krall, "Magnetically Positioned Photographic Film".
Eastman Kodak Company, *Data Code Magnetic Control Surface*, 1983.

*Primary Examiner*—William M. Shoop, Jr.
*Assistant Examiner*—Brian K. Young
*Attorney, Agent, or Firm*—Francis H. Boss, Jr.

[57] ABSTRACT

A self-clocking three-part encoded data stream is recorded on a magnetic media during a velocity varying period of time. The recording device encodes clock and data pulses. The polarity of the clock and data pulses are requried to be known in order to correctly decode the encoded information. Without this polarity information, the equipment manufacturer will be tightly constrained to maintain the proper coil wiring convention to ensure the correct pulse polarity for the decode process. The Data Alignment scheme provides a reliable method for detecting the encoded data and clock pulse polarity.

3 Claims, 2 Drawing Sheets

U.S. PATENT DOCUMENTS

| | | | |
|---|---|---|---|
| 4,437,742 | 3/1984 | Taniguchi | 354/21 |
| 4,443,077 | 4/1984 | Tanikawa | 354/21 |
| 4,493,547 | 1/1985 | Bridges | 354/424 |
| 4,497,552 | 2/1985 | Howard et al. | 354/106 |
| 4,500,183 | 2/1985 | Tanikawa | 354/21 |
| 4,511,229 | 4/1985 | Schwartz et al. | 354/20 |
| 4,515,452 | 5/1985 | Tsuzuki | 354/106 |
| 4,524,462 | 6/1985 | Cottatelucci | 455/608 |
| 4,544,259 | 10/1985 | Kanaoka et al. | 355/1 |
| 4,548,492 | 10/1985 | Kanaoka et al. | 355/50 |
| 4,553,833 | 11/1985 | Kanaoka et al. | 355/40 |
| 4,554,591 | 12/1985 | Kee | 358/256 |
| 4,574,319 | 3/1986 | Konishi | 358/335 |
| 4,577,961 | 3/1986 | Terashita | 355/77 |
| 4,583,831 | 4/1986 | Harvey | 354/106 |
| 4,592,072 | 5/1986 | Stewart | 375/55 |
| 4,613,911 | 9/1986 | Ohta | 360/3 |
| 4,659,198 | 4/1987 | Beauviala et al. | 352/92 |
| 4,659,213 | 4/1987 | Matsumoto | 355/38 |
| 4,684,229 | 8/1987 | Utsugi | 354/106 |
| 4,689,696 | 8/1987 | Plummer | 358/333 |
| 4,689,802 | 8/1987 | McCambridge | 375/22 |
| 4,702,580 | 10/1987 | Denner | 354/106 |
| 4,705,372 | 11/1987 | Lapeyre | 354/106 |
| 4,728,978 | 3/1988 | Inoue et al. | 354/289 |
| 4,736,215 | 4/1988 | Hudspeth et al. | 354/21 |
| 4,774,534 | 9/1988 | Kazumi et al. | 354/21 |
| 4,779,145 | 10/1988 | Lemelson | 360/2 |
| 4,797,713 | 1/1989 | Terashita et al. | 355/77 |

FOREIGN PATENT DOCUMENTS

| | | |
|---|---|---|
| 2746036 | 10/1977 | Fed. Rep. of Germany . |
| 225088A3 | 10/1973 | German Democratic Rep. . |
| 53-106115 | 2/1977 | Japan . |
| 56-95232 | 12/1979 | Japan . |
| 58-128893 | 1/1982 | Japan . |
| 59-04635 | 12/1982 | Japan . |
| 59-201055 | 4/1983 | Japan . |
| 60-14239 | 7/1983 | Japan . |
| 60-14239 | 7/1983 | Japan . |
| 59-162549 | 8/1983 | Japan . |
| 60-53952 | 9/1983 | Japan . |
| 60-185940 | 9/1985 | Japan . |
| 60-185941 | 9/1985 | Japan . |
| 61-246730 | 11/1986 | Japan . |
| 63-165835 | 12/1986 | Japan . |
| 63-165836 | 12/1986 | Japan . |
| 62-112141 | 5/1987 | Japan . |
| 62-112142 | 5/1987 | Japan . |
| 2083652 | 9/1980 | United Kingdom . |
| 2079566 | 1/1982 | United Kingdom . |
| 20834418 | 7/1984 | United Kingdom . |
| 2158955A | 11/1985 | United Kingdom . |

DATA ALIGNMENT CIRCUIT AND METHOD FOR SELF-CLOCKING ENCODED DATA

CROSS REFERENCE TO RELATED APPLICATIONS

This application discloses subject matter related to subject matter disclosed in U.S. patent application Ser. No. 255,693 filed herewith entitled "Film Information Exchange System Using Dedicated Magnetic Tracks on Film " by Robert P. Cloutier et al; U.S. patent application Ser. No. 255,798 filed herewith entitled "Frame-By-Frame Data Recording Film Information Exchange System Using Dedicated Magnetic Tacks on Film" by Robert P. Cloutier et al., now abandoned in favor of U.S. continuation patent application Ser. No. 391,687, filed Aug. 10, 1989; U.S. patent application Ser. No. 254,982 filed herewith entitled "Film Information Exchange System Using Dedicated Magnetic Tacks on Film with Virtual Data Identifiers" by Gary L. Robison, now abandoned in favor of U.S. continuation patent application Ser. No. 394,248, filed Aug. 14, 1989; U.S. patent application Ser. No. 254,987 filed herewith entitled "Self-Clocking Encoding/Decoding Film Information Exchange System Using Dedicated Magnetic Tracks on Film" by Michael L. Wash et al.; U.S. patent application Ser. No. 255,580 filed herewith entitled "Photofinishing Apparatus with Film Information Exchange System Using Dedicated Magnetic Tracks on Film" by Gary L. Robison et al., now abandoned in favor of U.S. continuation patent application Ser. No. 391,696, filed Aug. 10, 1989; U.S. patent application Ser. No. 255,006 filed herewith entitled "Order Entry Process for Magnetically Encodable Film with Dedicated Magnetic Tracks" by Gary L. Robison et al., abandoned in favor of U.S. continuation patent application Ser. No. 391,675, filed Aug. 10, 1989, which itself is now abandoned in favor of U.S. continuation patent application Ser. No. 488,496, filed Mar. 2, 1990; U.S. patent application Ser. No. 255,892 filed herewith entitled "Printing and Makeover Process for Magnetically Encodable Film with Dedicated Magnetic Tracks" by Gary L. Robison et al.; U.S. patent application Ser. No. 255,891 filed herewith entitled "Finishing Process For Magnetically Encodable Film With Dedicated Magnetic Tracks" by Gary L. Robison et al., abandoned in favor of U.S. continuation patent application Ser. No. 391,688, filed Aug. 10, 1989, which itself is now abandoned in favor of U.S. continuation patent application Ser. No. 489,758, filed Mar. 1, 1990; U.S. patent application Ser. No. 255,002 filed herewith entitled "Film-To-Video Player Using Dedicated Magnetic Tracks on Film" by Michael L. Wash, now abandoned; U.S. patent application Ser. No. 254,998 filed herewith entitled "Photofinishing Process With Film-To-Video Printer Using Dedicated Magnetic Tracks on Film" by Michael L. Wash, abandoned in favor of U.S. continuation patent application Ser. No. 361,751, filed June 1, 1989, which itself is now abandoned in favor of U.S. continuation patent application Ser. No. 437,282, filed Nov. 15, 1989; U.S. patent application Ser. No. 255,672 filed herewith entitled "Implicit Mid Roll Interrupt Protection Code For Camera Using Dedicated Magnetic Tracks On Film", now abandoned in favor of continuation U.S. patent application Ser. No. 449,343 filed Dec. 5, 1989; all assigned to the assignee of the present application.

BACKGROUND OF THE INVENTION

Encoding and decoding a self-clocking three-part data stream is discussed in U.S. patent application Ser. No. 206,407, "Three-Part Decoder Circuit" by Michael Lee Wash filed June 14, 1988, now abandoned; U.S. patent application Ser. No. 206,408, "Three-Part Encoder Circuit" by Arthur Allan Whitfield and Michael Lee Wash filed June 14, 1988, now U.S. Pat. No. 4,912,467, issued Mar. 27, 1990; U.S. patent application Ser. No. 206,553, "Three-Part Decoder Circuit" by Arthur Allan Whitfield filed June 14, 1988, now U.S. Pat. No. 4,876,697, issued Oct. 24, 1989; and U.S. patent application Ser. No. 206,646, "Method For Modulating A Binary Data Stream" by Michael Lee Wash filed June 14, 1988, now abandoned, the disclosures of which are incorporated herein by reference.

Storing information magnetically on moving media involves encoding clock and data pulses in a fashion that provides a reliable decoding means. The encoding method generally defines the decoding means.

In three-part encoding, the polarity of the clock pulses are the opposite of the polarity of the data pulses. The scheme makes the decoding process easier than, for example, a data stream encoded using MFM. An additional problem with the three-part encoding scheme is knowing, in the decode mode, which polarity pulse represents a clock bit and which polarity pulse represents a data bit. Once the polarity of pulses has been established, the decode process becomes trivial.

SUMMARY OF THE INVENTION

A unique, recognizable, encoded pattern was developed that could easily be identified in a stream of data without an established convention for data pulse polarity and clock pulse polarity. The pattern identifies the polarity convention used for encoding the data to follow.

The pattern contains a known code violation. In the preferred three-part encoding method, the data transition for a given bitcell must occur either in the first half of the bitcell or in the second half of the bitcell. The data pulse may not occur at the 50% or mid point, of the bitcell. If it did, the decoder would not be capable of reliably decoding the data.

For the beginning of the unique recognizable pattern, a burst of constant frequency is recorded. This being a code violation since pulses occur at the 50% point between adjacent pulses. After this burst of constant frequency, a significant period of time is allowed to pass before the next three pulses are recorded. This time being preferably chosen to be eight times the period or 16 times the pulse time of the constant frequency used for the previous burst The last three pulses, also a code violation are recorded at the same burst frequency at the beginning burst.

The data pulse alignment takes place as the first pulse has been read, or decoded, after the long period between pulses is detected. The polarity of this first pulse after the long period can be assigned, by convention, to be, for example, a data pulse. From this point, in the recorded data stream, pulses of that polarity can be decoded as data pulses and those of opposite polarity can be decoded as clock pulses.

At the end of the data stream, a complimentary pattern can be recorded such that, if the reproduce device is approaching the encoded data in a backward direction, the data and clock pulses can be aligned, or assigned the proper polarity, prior to reading real data. At this point, based on the three-part encoding scheme, the data can be properly interpreted.

LIST OF FIGURES

The invention may be understood by reference to the accompanying drawings, of which:

DETAILED DESCRIPTION OF THE INVENTION

Figure 1:
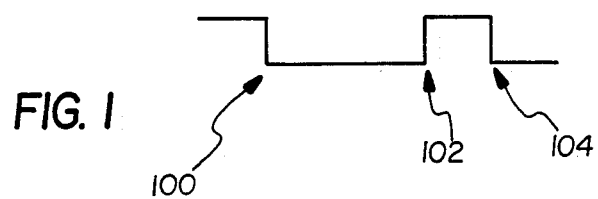
FIG. 1 is a diagram showing a typical three-part encoded data stream.
Figure 1A:
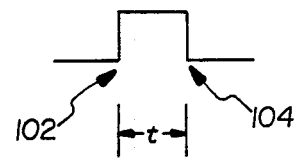
FIG. 1A is an isolated diagram of the data pulse depicted in FIG. 1.

FIG. 1 illustrates a typical three-part encoded tit cell where, in this example, the clock bit transition 100 is negative going when read in the forward direction (left to right), and the data bit transition 102 is positive going when read in the forward direction. The bitcell is completed by the start of the next bitcell as the clock for the next bitcell 104 is encoded. FIG. 1a shows the detail of the data pulse, indicating the nominal time (t) for the time duration between the encoding of the data pulse and encoding the next clock pulse.

Figure 2:
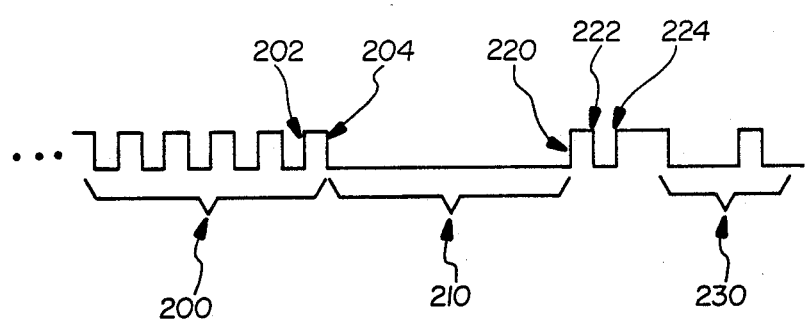
FIG. 2 is a diagram showing the preferred encoded data stream for data alignment.

The data alignment pattern is illustrated in FIG. 2. The leading burst pattern 200 contains constant time duration pulses. The time duration of these pulses, the time between one transition 202 and the next 204, is comparable to the time duration of the encoded bit as shown in FIG. 1a. The long time duration period 210 after the constant time duration pulses 200 identifies the pulse stream as being a data alignment stream. The duration of 210 is preferably chosen to be longer than a typical time period in a data stream such that a digital or analog state machine could identify this time duration as being unique. The pulse transition 220 immediately following the long time duration 210 designates the transition polarity of a data bit. In this illustration, when traversing the encoded pattern in the forward direction, from left to right, the polarity of the data transition for the forthcoming data stream is to be positive. This consequently identifies the clock transitions for the forthcoming data stream to be negative. The two transitions 222 and 224 following the data direction designator 220 are provided to realign the encoding pattern such that the first encoded bit cell 230 can be properly decoded.

Figure 3:
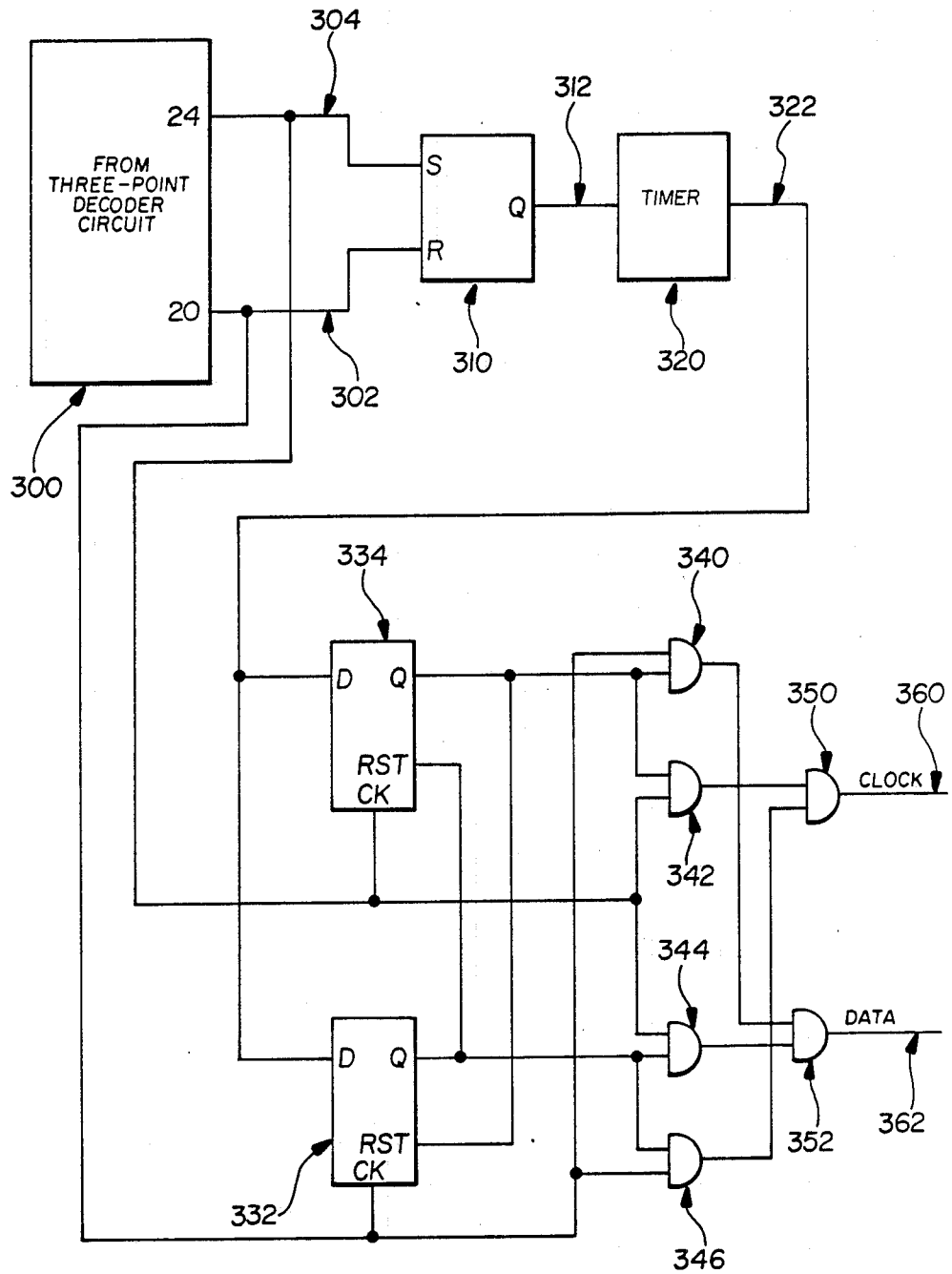
FIG. 3 is a block diagram of a circuit to decode the encoded data alignment pattern.

FIG. 3 illustrates a typical circuit block diagram to be used for detecting the data alignment pattern and aligning the data stream such that the clock and data transitions are properly decoded. The decoder circuit 300, reference Application Ser. No. 206,407 filed June 14, 1988, now abandoned, FIG. 2, produces a pulse 302 to indicate a positive transition has been read and a pulse 304 to indicate a negative transition has been read. The pulses are used by a S-R type flip-flop 310 to create a single pulse stream 312 where by a positive transition pulse sets the flip-flop and a negative transition pulse resets the flip-flop. The timer module 320 measures the time between pulses on line 312 such that when the time of the current pulse exceed, for example, 8 times the pulse time of the previous pulse time, an enabling line 322 is set. After 322 is set, the next transition pulse, positive 302 or negative 304, will latch either flip-flop 332 or 334 respectively. If flip-flop 332 is latched, positive transition pulses will be designated as decoded data bits and conversely, if flip-flop 334 is latched, negative transition pulses will be designated as decoded data bits. AND gates 340, 342, 344, and 346 in combination with OR gates 350 and 352 serve to route the proper polarity pulse lines 302 and 304, to the decoded output clock 360 and decoded output data 362 lines.

While the invention has been described in detail by specific reference to preferred embodiments thereof, it is understood that other variations and modifications may be made without departing from the spirit and scope of the invention.

What is claimed is:

1. In a binary data encoding and decoding system which generates a train of clock and data pulses, each pulse consisting of first and second edges, wherein one of two binary states is represented by the location of said second edge between said first edge of said pulse and the first edge of the next succeeding pulse in said train, and wherein said first edge is one of a positive-going edge or a negative-going edge, while said second edge is the other, a system for consistently defining said first and second edges as respective ones of said positive- and negative-going edges, said system comprising:

an encoding system means for transforming binary data into said train of pulses, said encoding system including means for transmitting, during a periodic hiatus in said train of pulses, an alignment mark waveform having no transitions for a period of time corresponding to that typically occupied by at least two of said pulses, followed by a defining edge which is either one of a positive-going edge or a negative-going edge, said alignment mark waveform identifying the first and second edge polarity convention for the train of pulses; and a decoding system means for receiving said train of pulses and transforming them into binary data, said decoding system including means for detecting said alignment mark waveform and for associating a predetermined one of said first and second edges with said defining edge during subsequent decoding operations, so as to consistently define said first and second edges as respective ones of said positive-going and negative-going edges.

2. The system of claim 1, wherein said alignment mark waveform transmitted by said encoding system means includes a unique recognizable pattern of pulses, said pattern containing a known coding violation.

3. The system of claim 2, wherein said unique recognizable pattern of pulses comprises a burst of pulses of constant frequency.

* * * * *

UNITED STATES PATENT AND TRADEMARK OFFICE
CERTIFICATE OF CORRECTION

PATENT NO. : 4,965,575
DATED : October 23, 1990
INVENTOR(S) : Michael L. Wash

It is certified that error appears in the above-identified patent and that said Letters Patent is hereby corrected as shown below:

In the Abstract, line 5     "requried" should read
                                --required--

Col. 2, line 54             "burstThe" should read
                                --burst. The--

Col. 3, line 19             "tit" should read --bit--

Signed and Sealed this

Fourth Day of February, 1992

Attest:

HARRY F. MANBECK, JR.

Attesting Officer

Commissioner of Patents and Trademarks

UNITED STATES PATENT AND TRADEMARK OFFICE
CERTIFICATE OF CORRECTION

PATENT NO. : 4,965,575
DATED : October 23, 1990
INVENTOR(S) : Michael L. Wash

It is certified that error appears in the above-identified patent and that said Letters Patent is hereby corrected as shown below:

On the Title Page
Attorney, Agent, or Firm

"Boss" should read --Boos--

Signed and Sealed this

Twenty-first Day of April, 1992

Attest:

HARRY F. MANBECK, JR.

*Attesting Officer*  *Commissioner of Patents and Trademarks*